United States Patent
Li

(10) Patent No.: US 10,356,874 B2
(45) Date of Patent: Jul. 16, 2019

(54) BACKLIGHTING DIMMING CIRCUIT AND LIQUID CRYSTAL DISPLAY

(71) Applicant: Shenzhen China Star Optoelectronics Technology Co., Ltd., Shenzhen (CN)

(72) Inventor: Wendong Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 352 days.

(21) Appl. No.: 15/032,052

(22) PCT Filed: Apr. 12, 2016

(86) PCT No.: PCT/CN2016/079014
§ 371 (c)(1),
(2) Date: Apr. 25, 2016

(87) PCT Pub. No.: WO2017/152463
PCT Pub. Date: Sep. 14, 2017

(65) Prior Publication Data
US 2018/0092170 A1 Mar. 29, 2018

(30) Foreign Application Priority Data
Mar. 8, 2016 (CN) .......................... 2016 1 0130393

(51) Int. Cl.
*H05B 33/08* (2006.01)
*H01L 23/50* (2006.01)
(Continued)

(52) U.S. Cl.
CPC ............. *H05B 33/089* (2013.01); *G09G 3/34* (2013.01); *H01L 23/50* (2013.01);
(Continued)

(58) Field of Classification Search
None
See application file for complete search history.

(56) References Cited

U.S. PATENT DOCUMENTS 7,633,463 B2 * 12/2009 Negru ................ H05B 33/0857
315/169.1
8,896,230 B1 * 11/2014 Zhang ...................... G09G 3/36
315/224
(Continued)

FOREIGN PATENT DOCUMENTS

CN 202930012 U 5/2013

*Primary Examiner* — Crystal L Hammond
(74) *Attorney, Agent, or Firm* — Leong C. Lei

(57) ABSTRACT

The present invention provides a backlighting dimming circuit and a liquid crystal display. The backlighting dimming circuit includes an external dimmer module (200) that receives a pulse dimming signal (PWM) to control a current regulation tube (Q1) included in the external dimmer module (200) to conduct on or cut off so as to control an LED light bar (300) to conduct on or cut off. A constant current driving chip (100) needs only one first terminal pin (1) provided thereto and through comparison of a voltage level at the first terminal pin (1) with a preset protection voltage level built in the constant current driving chip (100), an operation of conducting on or cutting of the LED light bar (300) can be carried out so that the number of the terminal pins necessary for the constant current driving chip can be reduced and thus, a packaging size of the constant current driving chip is reduced and the efficiency of tuning and testing of the backlighting dimming circuit is increased.

8 Claims, 2 Drawing Sheets

(51) Int. Cl.
*G09G 3/34* (2006.01)
*G02F 1/1335* (2006.01)

(52) U.S. Cl.
CPC ..... *H05B 33/0812* (2013.01); *H05B 33/0815* (2013.01); *H05B 33/0845* (2013.01); *G02F 1/133603* (2013.01); *G02F 2001/133612* (2013.01); *G09G 2320/0626* (2013.01); *Y02B 20/341* (2013.01); *Y02B 20/345* (2013.01)

(56) References Cited

U.S. PATENT DOCUMENTS

| | | | | |
|---|---|---|---|---|
| 9,018,859 | B2* | 4/2015 | Hu | H05B 33/0815 |
| | | | | 315/307 |
| 9,131,583 | B2* | 9/2015 | Zhang | H05B 33/0815 |
| 9,875,697 | B2* | 1/2018 | Kang | G09G 3/342 |
| 2006/0145670 | A1* | 7/2006 | Zhou | H02M 3/156 |
| | | | | 323/222 |
| 2006/0175986 | A1* | 8/2006 | Lee | G09G 3/342 |
| | | | | 315/312 |
| 2008/0143266 | A1* | 6/2008 | Langer | H05B 33/0818 |
| | | | | 315/185 R |
| 2008/0202312 | A1* | 8/2008 | Zane | G09G 3/342 |
| | | | | 84/297 R |
| 2009/0187925 | A1* | 7/2009 | Hu | H05B 33/0815 |
| | | | | 719/327 |
| 2010/0045194 | A1* | 2/2010 | Peker | H05B 33/0815 |
| | | | | 315/185 R |
| 2011/0037399 | A1* | 2/2011 | Hung | H05B 33/0815 |
| | | | | 315/219 |
| 2011/0260645 | A1* | 10/2011 | Chen | G09G 3/3406 |
| | | | | 315/294 |
| 2012/0146541 | A1* | 6/2012 | Szczeszynski | H05B 33/0815 |
| | | | | 315/294 |
| 2012/0181950 | A1* | 7/2012 | Yu | H05B 33/0815 |
| | | | | 315/294 |
| 2012/0212143 | A1* | 8/2012 | Esaki | H05B 33/089 |
| | | | | 315/192 |
| 2012/0256894 | A1* | 10/2012 | Jang | H05B 33/0815 |
| | | | | 345/211 |
| 2012/0268021 | A1* | 10/2012 | Lee | H05B 33/0815 |
| | | | | 315/192 |
| 2012/0274877 | A1* | 11/2012 | Sasaki | G09G 3/3406 |
| | | | | 349/69 |
| 2013/0009557 | A1* | 1/2013 | Szczeszynski | H05B 33/0827 |
| | | | | 315/186 |
| 2013/0044272 | A1* | 2/2013 | Gao | H05B 33/0815 |
| | | | | 349/61 |
| 2013/0050288 | A1* | 2/2013 | Kang | H05B 33/0815 |
| | | | | 345/690 |
| 2013/0127353 | A1* | 5/2013 | Athalye | H05B 33/0815 |
| | | | | 315/193 |
| 2013/0147360 | A1* | 6/2013 | Kang | H05B 37/02 |
| | | | | 315/122 |
| 2013/0169190 | A1* | 7/2013 | Fujita | G09G 3/342 |
| | | | | 315/307 |
| 2013/0321484 | A1* | 12/2013 | Kim | G09G 3/3233 |
| | | | | 345/690 |
| 2014/0049730 | A1* | 2/2014 | Lu | H05B 33/0815 |
| | | | | 349/69 |
| 2014/0139498 | A1* | 5/2014 | Hussain | G09G 3/342 |
| | | | | 345/204 |
| 2014/0246979 | A1* | 9/2014 | Zhang | H05B 33/0815 |
| | | | | 315/122 |
| 2014/0339991 | A1* | 11/2014 | Zhang | G09G 3/36 |
| | | | | 315/186 |
| 2014/0340000 | A1* | 11/2014 | Zhang | G09G 3/3406 |
| | | | | 315/307 |
| 2014/0340295 | A1* | 11/2014 | Zhang | H05B 33/0809 |
| | | | | 345/102 |
| 2014/0354180 | A1* | 12/2014 | Zhang | H05B 33/0845 |
| | | | | 315/307 |
| 2015/0116379 | A1* | 4/2015 | Lim | G09G 3/3406 |
| | | | | 345/691 |
| 2015/0130361 | A1* | 5/2015 | Zhang | H05B 33/083 |
| | | | | 315/186 |
| 2015/0154917 | A1* | 6/2015 | Jung | H05B 33/0815 |
| | | | | 345/102 |
| 2015/0156836 | A1* | 6/2015 | Han | H05B 33/0812 |
| | | | | 315/186 |
| 2016/0044760 | A1* | 2/2016 | Robert | H05B 33/0851 |
| | | | | 315/151 |
| 2016/0255693 | A1* | 9/2016 | Wang | H05B 33/0812 |
| | | | | 315/185 R |
| 2016/0330806 | A1* | 11/2016 | Yamashita | H05B 33/0818 |
| 2017/0027034 | A1* | 1/2017 | Nozawa | H05B 33/0842 |
| 2017/0170727 | A1* | 6/2017 | Mizuno | H02M 3/156 |
| 2017/0339756 | A1* | 11/2017 | Ahn | H05B 33/0812 |
| 2018/0014370 | A1* | 1/2018 | Wang | H05B 33/0812 |

* cited by examiner

BACKLIGHTING DIMMING CIRCUIT AND LIQUID CRYSTAL DISPLAY

BACKGROUND OF THE INVENTION

1. Field of the Invention

The present invention relates to the field of display technology, and in particular to a backlighting dimming circuit and a liquid crystal display.

2. The Related Arts

Liquid crystal display (LCD) has a variety of advantages, such as thin device body, low power consumption, and being free of radiation and is thus used in various applications, such as liquid crystal televisions, mobile phones, personal digital assistants (PDAs), digital cameras, computer monitors, and notebook computer screens.

Most of the liquid crystal displays that are currently available in the market are backlighting LCDs, which comprise a liquid crystal panel and a backlight module. The working principle of the liquid crystal panel is that a driving voltage is applied to a thin-film transistor (TFT) array substrate and a color filter (CF) substrate to control rotation directions of liquid crystal molecules interposed between the two substrates in order to refract out light from the backlight module to generate an image.

Since a liquid crystal panel does not emit light by itself, lighting must be provided from the backlight module for normally displaying an image. Thus, the backlight module is one of the key components of the liquid crystal display. According to the location where light gets incident, the backlight modules can be divided into two types, namely side-edge backlight modules and direct backlight modules. The direct backlight modules are structured by arranging a luminous light source, such as a cold cathode fluorescent lamp (CCFL) or a light-emitting diode (LED) at a back side of the liquid crystal panel to form a surface light source that directly supplies lighting to the liquid crystal panel. The side-edge backlight module comprise an LED light bar that is arranged behind one side edge of the liquid crystal panel to serve as a backlighting source.

Heretofore, dimming of the backlighting source made up of an LED light bar is achieved by feeding a low-frequency pulse dimming signal to a balance integrated circuit (IC), which is a constant current driving chip, to conduct on or cut off a constant regulating diode connected in series with the LED light bar. FIG. 1 illustrates a circuit diagram of a conventional backlighting dimming circuit, in which a balance IC 100' comprises three terminal pins, of which the first terminal pin 1' receives a pulse dimming signal PWM externally supplied to the balance IC 100', the second terminal pin 2' supplies the pulse dimming signal PWM from the balance IC 100' to a constant regulation tube Q1' to control the constant regulation tube Q1' to conduct on or cut off, and the third terminal pin 3' receives a feedback signal Isen. The constant regulation tube Q1' is connected in series with the LED light bard 200', which serves as the backlighting source. The balance IC 100' used in the conventional backlighting dimming circuit, due to involving three terminal pins, requires a relatively large size of packaging and this increases the cost of the backlighting dimming circuit. Further, since the number of the terminal pins is great, tuning and testing of the backlighting dimming circuit is not convenient.

SUMMARY OF THE INVENTION

An object of the present invention is to provide a backlighting dimming circuit, which reduces the number of terminal pins involved in a balance integrated circuit (IC) and thus reduce a packaging size of the balance IC and increases efficiency of tuning and testing of the backlighting dimming circuit.

Another object of the present invention is to provide a liquid crystal display, which comprises a backlighting dimming circuit that reduces the number of terminal pins involved in a balance integrated circuit (IC) and thus reduces a packaging size of the balance IC and shows a relatively high efficiency of tuning and testing.

To achieve the above object, the present invention provides a backlighting dimming circuit, which comprises: a constant current driving chip, an external dimmer module electrically connected to the constant current driving chip, and an LED light bar electrically connected to the external dimmer module;

the constant current driving chip comprising a first terminal pin, the external dimmer module being electrically connected via the first terminal pin to the constant current driving chip;

the LED light bar comprising a plurality of LEDs connected in series, the LED light bar having one end connected to and receiving a backlighting output voltage and an opposite end electrically connected to the external dimmer module;

the external dimmer module comprising: a first resistor, a second resistor, a third resistor, a diode, and a current regulation tube electrically connected to one another, the external dimmer module being connected to and receiving the pulse dimming signal to control the LED light bar to conduct on or cut off.

In the external dimmer module:

the first resistor has one end connected to and receives an input voltage and an opposite end electrically connected to a source of the current regulation tube and an anode of the diode;

the diode is arranged to have the anode thereof electrically connected to the opposite end of the first resistor and the source of the current regulation tube and a cathode thereof electrically connected to an end of the second resistor and the first terminal pin of the constant current driving chip;

the second resistor is arranged to have the one end thereof electrically connected to the cathode of the diode and the first terminal pin of the constant current driving chip and an opposite end thereof electrically connected to one end of the third resistor and the opposite end of the LED light bar;

the third resistor is arranged to have the one end thereof electrically connected to the opposite end of the second resistor and the opposite end of the LED light bar and an opposite end thereof grounded; and the current regulation tube is arranged to have a gate thereof connected to and receiving the pulse dimming signal, the source thereof electrically connected to the opposite end of the first resistor and the anode of the diode, and a drain thereof grounded.

The constant current driving chip receives a feedback current through the first terminal pin; the constant current driving chip comprises a preset protection voltage level built therein; and the constant current driving chip is operable to compare a voltage level at the first terminal pin with the present protection voltage level to carry out an operation of conducting on or cutting of the LED light bar.

The input voltage has a voltage level higher than the preset protection voltage level of the constant current driving chip.

The present invention also provides a liquid crystal display, which comprises a backlighting dimming circuit, the backlighting dimming circuit comprising: a constant current driving chip, an external dimmer module electrically connected to the constant current driving chip, and an LED light bar electrically connected to the external dimmer module;

the constant current driving chip comprising a first terminal pin, the external dimmer module being electrically connected via the first terminal pin to the constant current driving chip;

the LED light bar comprising a plurality of LEDs connected in series, the LED light bar having one end connected to and receiving a backlighting output voltage and an opposite end electrically connected to the external dimmer module;

the external dimmer module comprising: a first resistor, a second resistor, a third resistor, a diode, and a current regulation tube electrically connected to one another, the external dimmer module being connected to and receiving the pulse dimming signal to control the LED light bar to conduct on or cut off.

In the external dimmer module:

the first resistor has one end connected to and receives an input voltage and an opposite end electrically connected to a source of the current regulation tube and an anode of the diode;

the diode is arranged to have the anode thereof electrically connected to the opposite end of the first resistor and the source of the current regulation tube and a cathode thereof electrically connected to an end of the second resistor and the first terminal pin of the constant current driving chip;

the second resistor is arranged to have the one end thereof electrically connected to the cathode of the diode and the first terminal pin of the constant current driving chip and an opposite end thereof electrically connected to one end of the third resistor and the opposite end of the LED light bar;

the third resistor is arranged to have the one end thereof electrically connected to the opposite end of the second resistor and the opposite end of the LED light bar and an opposite end thereof grounded; and the current regulation tube is arranged to have a gate thereof connected to and receiving the pulse dimming signal, the source thereof electrically connected to the opposite end of the first resistor and the anode of the diode, and a drain thereof grounded.

The constant current driving chip receives a feedback current through the first terminal pin; the constant current driving chip comprises a preset protection voltage level built therein; and the constant current driving chip is operable to compare a voltage level at the first terminal pin with the present protection voltage level to carry out an operation of conducting on or cutting of the LED light bar.

The input voltage has a voltage level higher than the preset protection voltage level of the constant current driving chip.

The present invention further provides a backlighting dimming circuit, which comprises: a constant current driving chip, an external dimmer module electrically connected to the constant current driving chip, and an LED light bar electrically connected to the external dimmer module;

the constant current driving chip comprising a first terminal pin, the external dimmer module being electrically connected via the first terminal pin to the constant current driving chip;

the LED light bar comprising a plurality of LEDs connected in series, the LED light bar having one end connected to and receiving a backlighting output voltage and an opposite end electrically connected to the external dimmer module;

the external dimmer module comprising: a first resistor, a second resistor, a third resistor, a diode, and a current regulation tube electrically connected to one another, the external dimmer module being connected to and receiving the pulse dimming signal to control the LED light bar to conduct on or cut off;

wherein in the external dimmer module:

the first resistor has one end connected to and receives an input voltage and an opposite end electrically connected to a source of the current regulation tube and an anode of the diode;

the diode is arranged to have the anode thereof electrically connected to the opposite end of the first resistor and the source of the current regulation tube and a cathode thereof electrically connected to an end of the second resistor and the first terminal pin of the constant current driving chip;

the second resistor is arranged to have the one end thereof electrically connected to the cathode of the diode and the first terminal pin of the constant current driving chip and an opposite end thereof electrically connected to one end of the third resistor and the opposite end of the LED light bar;

the third resistor is arranged to have the one end thereof electrically connected to the opposite end of the second resistor and the opposite end of the LED light bar and an opposite end thereof grounded; and the current regulation tube is arranged to have a gate thereof connected to and receiving the pulse dimming signal, the source thereof electrically connected to the opposite end of the first resistor and the anode of the diode, and a drain thereof grounded; and wherein the constant current driving chip receives a feedback current through the first terminal pin; the constant current driving chip comprises a preset protection voltage level built therein; and the constant current driving chip is operable to compare a voltage level at the first terminal pin with the present protection voltage level to carry out an operation of conducting on or cutting of the LED light bar.

The efficacy of the present invention is that the present invention provides a backlighting dimming circuit and a liquid crystal display, in which an external dimmer module is arranged to receive a pulse dimming signal to control a current regulation tube included in the external dimmer module to conduct on or cut off so as to control an LED light bar to conduct on or cut off. A constant current driving chip needs only one first terminal pin provided thereto and through comparison of a voltage level at the first terminal pin with a preset protection voltage level built in the constant current driving chip, an operation of conducting on or cutting of the LED light bar can be carried out so that the number of the terminal pins necessary for the constant current driving chip can be reduced and thus, a packaging size of the constant current driving chip is reduced and the efficiency of tuning and testing of the backlighting dimming circuit is increased.

BRIEF DESCRIPTION OF THE DRAWINGS

For better understanding of the features and technical contents of the present invention, reference will be made to the following detailed description of the present invention and the attached drawings. However, the drawings are provided for the purposes of reference and illustration and are not intended to impose limitations to the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
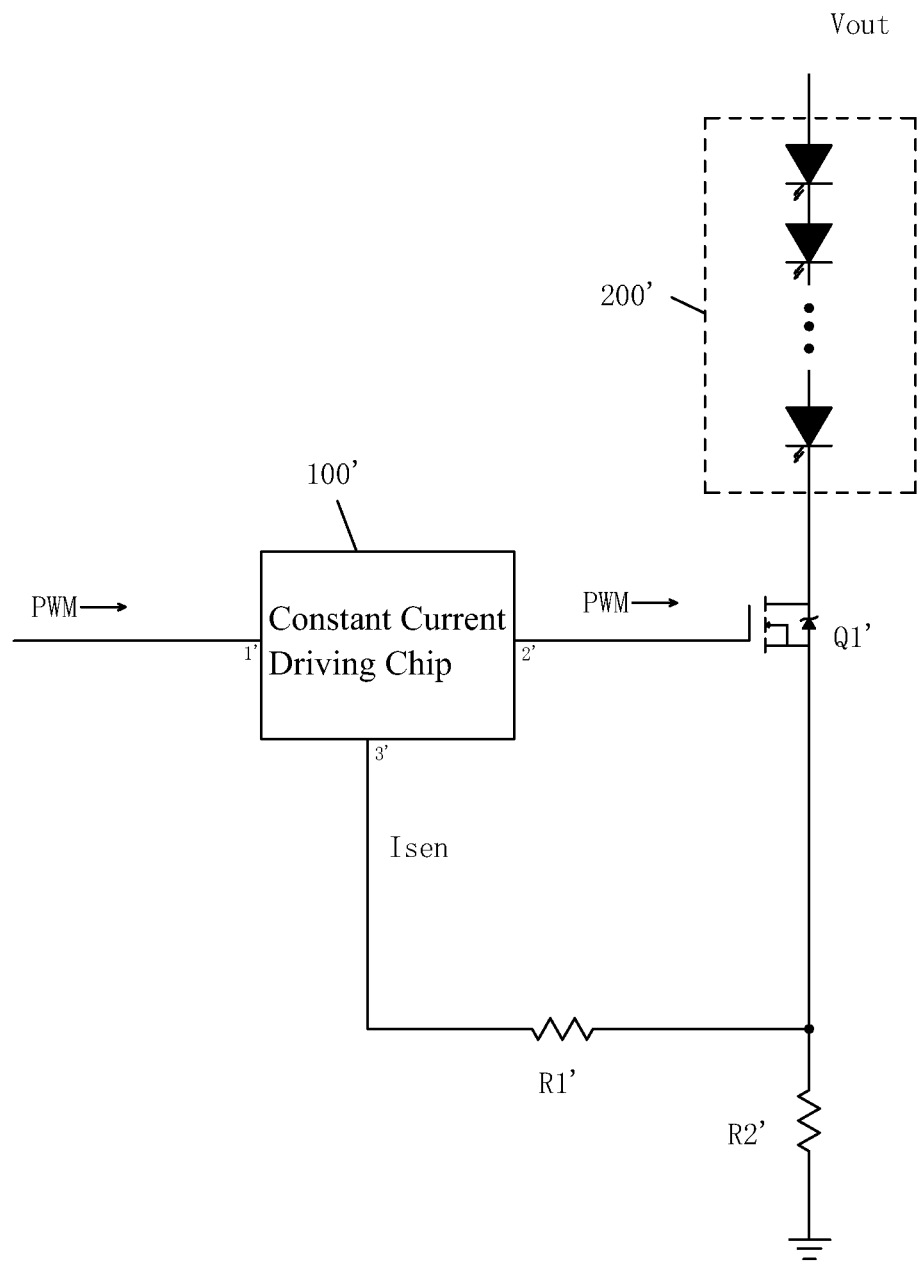
FIG. 1 is a circuit diagram of a conventional backlighting dimming circuit.
Figure 2:
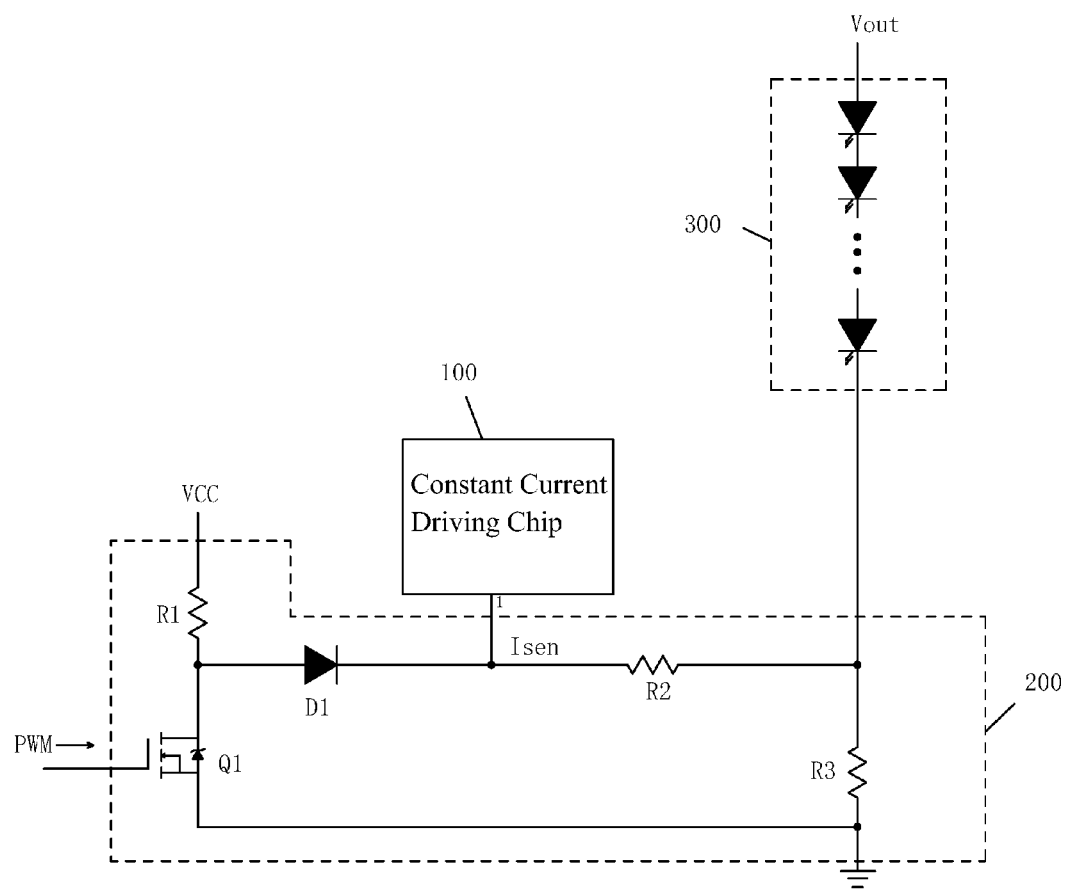
FIG. 2 is a circuit diagram of a backlighting dimming circuit according to the present invention.

Referring to FIG. 2, firstly, the present invention provides a backlighting dimming circuit, which comprises: a constant current driving chip 100, an external dimmer module 200 electrically connected to the constant current driving chip 100, and a light-emitting diode (LED) light bar 300 electrically connected to the external dimmer module 200.

Specifically, the constant current driving chip 100 comprises a first terminal pin 1. The external dimmer module 200 is electrically connected, via the first terminal pin 1, to the constant current driving chip 100.

The LED light bar 300 comprises a plurality of LEDs connected in series. The LED light bar 300 has an end connected to and receiving a backlighting output voltage Vout and an opposite end electrically connected to the external dimmer module 200.

The external dimmer module 200 comprises: a first resistor R1, a second resistor R2, a third resistor R3, a diode D1, and a current regulation tube Q1 electrically connected to one another. The external dimmer module 200 is connected to and receives a pulse dimming signal PWM for controlling the LED light bar 300 to conduct on or cut off. Further, in the external dimmer module 200:

the first resistor R1 has one end connected to and receives the input voltage VCC and an opposite end electrically connected to a source of the current regulation tube Q1 and an anode of the diode D1;

the diode D1 is arranged to have the anode thereof electrically connected to the opposite end of the first resistor R1 and the source of the current regulation tube Q1 and a cathode thereof electrically connected to an end of the second resistor R2 and the first terminal pin 1 of the constant current driving chip 100;

the second resistor R2 is arranged to have the one end thereof electrically connected to the cathode of the diode D1 and the first terminal pin 1 of the constant current driving chip 100 and an opposite end thereof electrically connected to one end of the third resistor R3 and the opposite end of the LED light bar 300;

the third resistor R3 is arranged to have the one end thereof electrically connected to the opposite end of the second resistor R2 and the opposite end of the LED light bar 300 and an opposite end thereof grounded; and the current regulation tube Q1 is arranged to have a gate thereof connected to and receiving the pulse dimming signal PWM, the source thereof electrically connected to the opposite end of the first resistor R1 and the anode of the diode D1, and a drain thereof grounded.

The constant current driving chip 100 receives a feedback current Isen through the first terminal pin 1. The constant current driving chip 100 is built therein with a preset protection voltage level. The constant current driving chip 100 compares a voltage level at the first terminal pin 1 with the preset protection voltage level to carry out an operation of conducting on or cutting off the LED light bar 300.

It is noted that in the present invention, the input voltage VCC has a voltage level that is higher than the preset protection voltage level of the constant current driving chip 100.

The backlighting dimming circuit of the present invention receives the pulse dimming signal PWM through the external dimmer module 200 to control the current regulation tube Q1 included in the external dimmer module 200 to conduct on or cut off thereby controlling the LED light bar 300 to conduct on or cut off. The constant current driving chip 100 needs only one first terminal pin 1, and through comparison of the voltage level at the first terminal pin 1 with the preset protection voltage level of the constant current driving chip 100, an operation is carried out to conduct on or cut off the LED light bar 300, whereby the number of terminal pins necessary for the constant current driving chip can be reduced and thus, a packaging size of the constant current driving chip is reduced and the efficiency of tuning and testing the backlighting dimming circuit is increased.

Specifically, when the pulse dimming signal PWM supplied to the external dimmer module 200 is of a high voltage level, the gate of the current regulation tube Q1 included in the external dimmer module 200 is controlled by the high voltage level to conduct the current regulation tube Q1 on so as to make the anode of the diode D1 and the source of the current regulation tube Q1 grounded, whereby the corresponding voltage is 0 and the LED light bar 300 is conducted on. Under this condition, the feedback current Isen that flows into the first terminal pin 1 of the constant current driving chip 100 is related to the backlighting output voltage Vout, but is not related to the input voltage VCC. A voltage level detected at the first terminal pin 1 is also related to the backlighting output voltage Vout and is not related to the input voltage VCC. When the pulse dimming signal PWM supplied to the external dimmer module 200 is of a low voltage level, the gate of current regulation tube Q1 included in the external dimmer module 200 is controlled by the low voltage level to cut off the current regulation tube Q1 and under this condition, the voltage level detected at the first terminal pin 1 is the voltage level of the input voltage VCC. Since the voltage level of the input voltage VCC is higher than the preset protection voltage level of the constant current driving chip 100, the constant current driving chip 100 is triggered to execute voltage protection so as to cut off the LED light bar 300.

Based on the same inventive idea, the present invention also provides a liquid crystal display, which comprises the backlighting dimming circuit shown in FIG. 2 to help reduce the number of the terminal pins necessary for the constant current driving chip and thus reducing a packaging size of the constant current driving chip and providing a higher efficiency of tuning and testing. No repeated description of the backlighting dimming circuit will be given herein.

In summary, the present invention provides a backlighting dimming circuit and a liquid crystal display, in which an external dimmer module is arranged to receive a pulse dimming signal to control a current regulation tube included in the external dimmer module to conduct on or cut off so as to control an LED light bar to conduct on or cut off. A constant current driving chip needs only one first terminal pin provided thereto and through comparison of a voltage level at the first terminal pin with a preset protection voltage level built in the constant current driving chip, an operation of conducting on or cutting of the LED light bar can be carried out so that the number of the terminal pins necessary for the constant current driving chip can be reduced and thus, a packaging size of the constant current driving chip is reduced and the efficiency of tuning and testing of the backlighting dimming circuit is increased.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A backlighting dimming circuit, comprising: a constant current driving chip, an external dimmer module electrically connected to the constant current driving chip, and a light-emitting diode (LED) light bar electrically connected to the external dimmer module;
   the constant current driving chip comprising a first terminal pin, the external dimmer module being electrically connected via the first terminal pin to the constant current driving chip;
   the LED light bar comprising a plurality of LEDs connected in series, the LED light bar having one end connected to and receiving a backlighting output voltage and an opposite end electrically connected to the external dimmer module;
   the external dimmer module comprising: a first resistor, a second resistor, a third resistor, a diode, and a current regulation tube electrically connected to one another, the external dimmer module being connected to and receiving a pulse dimming signal to control the LED light bar to conduct on or cut off;
   wherein in the external dimmer module:
   the first resistor has one end connected to and receives an input voltage and an opposite end electrically connected to a source of the current regulation tube and an anode of the diode;
   the diode is arranged to have the anode thereof electrically connected to the opposite end of the first resistor and the source of the current regulation tube and a cathode thereof electrically connected to an end of the second resistor and the first terminal pin of the constant current driving chip;
   the second resistor is arranged to have the one end thereof electrically connected to the cathode of the diode and the first terminal pin of the constant current driving chip and an opposite end thereof electrically connected to one end of the third resistor and the opposite end of the LED light bar;
   the third resistor is arranged to have the one end thereof electrically connected to the opposite end of the second resistor and the opposite end of the LED light bar and an opposite end thereof grounded; and
   the current regulation tube is arranged to have a gate thereof connected to and receiving the pulse dimming signal, the source thereof electrically connected to the opposite end of the first resistor and the anode of the diode, and a drain thereof grounded.

2. The backlighting dimming circuit as claimed in claim 1, wherein the constant current driving chip receives a feedback current through the first terminal pin; the constant current driving chip comprises a preset protection voltage level built therein; and the constant current driving chip is operable to compare a voltage level at the first terminal pin with the present protection voltage level to carry out an operation of conducting on or cutting of the LED light bar.

3. The backlighting dimming circuit as claimed in claim 2, wherein the input voltage has a voltage level higher than the preset protection voltage level of the constant current driving chip.

4. A liquid crystal display, comprising a backlighting dimming circuit, the backlighting dimming circuit comprising: a constant current driving chip, an external dimmer module electrically connected to the constant current driving chip, and a light-emitting diode (LED) light bar electrically connected to the external dimmer module;
   the constant current driving chip comprising a first terminal pin, the external dimmer module being electrically connected via the first terminal pin to the constant current driving chip;
   the LED light bar comprising a plurality of LEDs connected in series, the LED light bar having one end connected to and receiving a backlighting output voltage and an opposite end electrically connected to the external dimmer module;
   the external dimmer module comprising: a first resistor, a second resistor, a third resistor, a diode, and a current regulation tube electrically connected to one another, the external dimmer module being connected to and receiving a pulse dimming signal to control the LED light bar to conduct on or cut off;
   wherein the constant current driving chip receives a feedback current through the first terminal pin; the constant current driving chip comprises a preset protection voltage level built therein; and the constant current driving chip is operable to compare a voltage level at the first terminal pin with the present protection voltage level to cam out an operation of conducting on or cutting of the LED light bar.

5. The liquid crystal display as claimed in claim 4, wherein in the external dimmer module:
   the first resistor has one end connected to and receives an input voltage and an opposite end electrically connected to a source of the current regulation tube and an anode of the diode;
   the diode is arranged to have the anode thereof electrically connected to the opposite end of the first resistor and the source of the current regulation tube and a cathode thereof electrically connected to an end of the second resistor and the first terminal pin of the constant current driving chip;
   the second resistor is arranged to have the one end thereof electrically connected to the cathode of the diode and the first terminal pin of the constant current driving chip and an opposite end thereof electrically connected to one end of the third resistor and the opposite end of the LED light bar;
   the third resistor is arranged to have the one end thereof electrically connected to the opposite end of the second resistor and the opposite end of the LED light bar and an opposite end thereof grounded; and
   the current regulation tube is arranged to have a gate thereof connected to and receiving the pulse dimming signal, the source thereof electrically connected to the opposite end of the first resistor and the anode of the diode, and a drain thereof grounded.

6. The liquid crystal display as claimed in claim 4, wherein the input voltage has a voltage level higher than the preset protection voltage level of the constant current driving chip.

7. A backlighting dimming circuit, comprising: a constant current driving chip, an external dimmer module electrically connected to the constant current driving chip, and a light-emitting diode (LED) light bar electrically connected to the external dimmer module;

the constant current driving chip comprising a first terminal pin, the external dimmer module being electrically connected via the first terminal pin to the constant current driving chip;

the LED light bar comprising a plurality of LEDs connected in series, the LED light bar having one end connected to and receiving a backlighting output voltage and an opposite end electrically connected to the external dimmer module;

the external dimmer module comprising: a first resistor, a second resistor, a third resistor, a diode, and a current regulation tube electrically connected to one another, the external dimmer module being connected to and receiving a pulse dimming signal to control the LED light bar to conduct on or cut off;

wherein in the external dimmer module:

the first resistor has one end connected to and receives an input voltage and an opposite end electrically connected to a source of the current regulation tube and an anode of the diode;

the diode is arranged to have the anode thereof electrically connected to the opposite end of the first resistor and the source of the current regulation tube and a cathode thereof electrically connected to an end of the second resistor and the first terminal pin of the constant current driving chip;

the second resistor is arranged to have the one end thereof electrically connected to the cathode of the diode and the first terminal pin of the constant current driving chip and an opposite end thereof electrically connected to one end of the third resistor and the opposite end of the LED light bar;

the third resistor is arranged to have the one end thereof electrically connected to the opposite end of the second resistor and the opposite end of the LED light bar and an opposite end thereof grounded; and the current regulation tube is arranged to have a gate thereof connected to and receiving the pulse dimming signal, the source thereof electrically connected to the opposite end of the first resistor and the anode of the diode, and a drain thereof grounded; and wherein the constant current driving chip receives a feedback current through the first terminal pin; the constant current driving chip comprises a preset protection voltage level built therein; and the constant current driving chip is operable to compare a voltage level at the first terminal pin with the present protection voltage level to carry out an operation of conducting on or cutting of the LED light bar.

8. The backlighting dimming circuit as claimed in claim 7, wherein the input voltage has a voltage level higher than the preset protection voltage level of the constant current driving chip.

\* \* \* \* \*